(12) United States Patent
Tsai (10) Patent No.: US 10,609,800 B2
(45) Date of Patent: Mar. 31, 2020

(54) LIGHT STRING AND AUTOMATIC ASSEMBLY APPARATUS AND METHOD THEREOF

(71) Applicant: Cosmo Lighting Inc., Walnut, CA (US)

(72) Inventor: Nai-Chen Tsai, New Tapiei (TW)

(73) Assignee: COSMO LIGHTING INC., Walnut, CA (US)

(*) Notice: Subject to any disclaimer, the term of this patent is extended or adjusted under 35 U.S.C. 154(b) by 0 days.

(21) Appl. No.: 16/142,084

(22) Filed: Sep. 26, 2018

(65) Prior Publication Data

US 2019/0101253 A1    Apr. 4, 2019

Related U.S. Application Data

(60) Provisional application No. 62/565,327, filed on Sep. 29, 2017, provisional application No. 62/584,619, filed on Nov. 10, 2017.

(51) Int. Cl.
*H05B 45/48* (2020.01)
*B29C 39/10* (2006.01)
(Continued)

(52) U.S. Cl.
CPC ............ *H05B 45/48* (2020.01); *B29C 33/12* (2013.01); *B29C 33/42* (2013.01); *B29C 39/10* (2013.01); *B65H 54/14* (2013.01); *F21K 9/90* (2013.01); *F21S 4/10* (2016.01); *F21S 4/26* (2016.01); *F21V 17/04* (2013.01); *F21V 19/001* (2013.01); *F21V 19/0025* (2013.01);
(Continued)

(58) Field of Classification Search
CPC .............. H05B 33/083; H05B 33/0806; H05B 33/0845; F21S 4/10; F21S 4/26; B29C 33/42; B65H 54/14; F21V 17/04; F21V 19/0025; F21V 19/001; F21V 23/001; G06F 1/26; H01L 21/67144; H01L 21/67259; H01L 25/13; H01L 33/00; H01L 33/52; H01L 33/62; H01M 2/1016
See application file for complete search history.

(56) References Cited

U.S. PATENT DOCUMENTS

| | | | |
|---|---|---|---|
| 6,860,007 B1* | 3/2005 | Liu | F21S 4/26 29/825 |
| 2005/0111221 A1* | 5/2005 | Van Dyn Hoven | F21S 6/001 362/237 |
| 2012/0075863 A1* | 3/2012 | Chen | F21V 21/002 362/249.18 |

* cited by examiner

*Primary Examiner* — Mary Ellen Bowman
(74) *Attorney, Agent, or Firm* — Li & Cai Intellectual Property (USA) Office (57) ABSTRACT

A light string, an automatic assembly apparatus and an automatic assembly method thereof are provided. The method includes steps of: arranging lamp housings in a lamp housing carrier by using an assembly machine; actuating a holder to move horizontally by using the assembly machine to align light-emitting elements with accommodating spaces of the lamp housings, respectively; actuating the holder to move vertically toward the lamp housing carrier by using the assembly machine to move the light-emitting elements into the accommodating spaces to be bonded to the lamp housings, respectively; removing a first wire and a second wire together with the light-emitting elements from the holder by the assembly machine; passing the first wire and the second wire through lamp housing through holes of the lamp housings by using the assembly machine; and taking out the light string from the lamp housing carrier by using the assembly machine.

14 Claims, 10 Drawing Sheets

(51) Int. Cl.
     *B29C 33/12*    (2006.01)
     *F21K 9/90*     (2016.01)
     *H02J 7/00*     (2006.01)
     *H05B 45/00*    (2020.01)
     *H05B 45/40*    (2020.01)
     *F21S 4/10*     (2016.01)
     *B29C 33/42*    (2006.01)
     *F21V 17/04*    (2006.01)
     *F21V 19/00*    (2006.01)
     *F21V 23/00*    (2015.01)
     *F21S 4/26*     (2016.01)
     *B65H 54/14*    (2006.01)
     *H01L 21/67*    (2006.01)
     *H01L 25/075*   (2006.01)
     *H01L 33/52*    (2010.01)
     *H01L 33/62*    (2010.01)
     *H01L 25/13*    (2006.01)
     *H05B 45/10*    (2020.01)
     *H01L 33/00*    (2010.01)
     *H02G 1/12*     (2006.01)
     *G06F 1/26*     (2006.01)
     *H01M 2/10*     (2006.01)
     *F21Y 115/10*   (2016.01)
     *B29L 31/00*    (2006.01)
     *F21Y 103/10*   (2016.01)

(52) U.S. Cl.
     CPC .............. *F21V 23/001* (2013.01); *G06F 1/26* (2013.01); *H01L 21/67144* (2013.01); *H01L 21/67259* (2013.01); *H01L 25/0753* (2013.01); *H01L 25/13* (2013.01); *H01L 33/00* (2013.01); *H01L 33/52* (2013.01); *H01L 33/62* (2013.01); *H01M 2/1016* (2013.01); *H02G 1/1256* (2013.01); *H02J 7/007184* (2020.01); *H05B 45/00* (2020.01); *H05B 45/10* (2020.01); *H05B 45/40* (2020.01); *B29L 2031/747* (2013.01); *F21Y 2103/10* (2016.08); *F21Y 2115/10* (2016.08); *H01L 2933/005* (2013.01); *H01L 2933/0033* (2013.01); *H01L 2933/0066* (2013.01)

LIGHT STRING AND AUTOMATIC ASSEMBLY APPARATUS AND METHOD THEREOF

CROSS-REFERENCE TO RELATED PATENT APPLICATION

This application claims priority from U.S. Provisional Patent Application Ser. No. 62/565,327 filed on Sep. 29, 2017 and U.S. Provisional Patent Application Ser. No. 62/584,619 filed on Nov. 10, 2017. The entire content of the above identified applications is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light string, and more particularly to a light string, and an automatic assembly and an automatic assembly method for the light string.

BACKGROUND OF THE DISCLOSURE

Flash bulbs of different colors are essential decorations in festivals. Light bulbs of various colors are combined into a light string to achieve a festival-like atmosphere. For example, multiple rows of bulbs can be combined into a light string for Christmas, such that flashing lights of different colors from the bulbs can enhance the feeling of Christmas. However, the assembly of the traditional light strings for Christmas or other festivals requires manpower, which contributes to an extremely low production efficiency and a high labor cost.

SUMMARY OF THE DISCLOSURE

In response to the above-referenced technical inadequacies, the present disclosure provides an automatic assembly apparatus for a light string. The light string includes a first wire, a second wire, a plurality of light-emitting elements and a plurality of lamp housings. The automatic assembly apparatus includes a light housing carrier, a holder and an assembly machine. The lamp housings are arranged in lamp housing carrier along a longitudinal direction of the lamp housing carrier. Each of the lamp housings has an accommodating space and a lamp housing through hole extending through the lamp housing body. The first wire and the second wire are wound around the holder along a longitudinal direction of the holder. The light-emitting elements are attached across the first wire and the second wire that are adjacent to each other. The assembly machine is connected to the holder and configured to actuate the holder to move the light-emitting elements into the accommodating spaces of the lamp housings respectively. The assembly machine then removes the light-emitting elements together with the first wire and the second wire from the holder. The assembly machine then pass the first wire and the second wire through the lamp housing through holes of the lamp housings and winds the first wire and the second wire around the lamp housing carrier. The assembly machine then places a plurality of bonding elements in the accommodating spaces of the lamp housings, respectively, to bond the lamp housings with the corresponding light-emitting elements, parts of the first wire and parts of the second wire through the bonding elements to assemble the light string, and the light string is then taken out from the lamp housing carrier.

In addition, the present disclosure provides a light string assembled by using an automatic assembly apparatus. The automatic assembly apparatus includes a lamp housing carrier, a holder and an assembly machine connected to the holder. The light string includes a plurality of lamp housings, a first wire, a second wire and a plurality of first light-emitting elements. The lamp housings are arranged in the lamp housing carrier along a longitudinal direction of the lamp housing carrier. Each of the lamp housings has an accommodating space and a lamp housing through hole extending through the lamp housing body. The first wire and the second wire are wound around the holder along a longitudinal direction of the holder at a predetermined distance. The first light-emitting elements are attached across the first wire and the second wire. After the assembly machine actuates the holder to move, the first light-emitting elements are moved into the accommodating spaces of the lamp housings respectively. The first light-emitting elements are removed together with the first wire and the second wire from the holder by the assembly machine. The first wire and the second wire pass through the lamp housing through holes of the lamp housings and are wound around the lamp housing carrier by the assembly machine. A plurality of bonding elements are accommodated in the accommodating spaces of the lamp housings respectively to bond the lamp housings with the first light-emitting elements respectively, parts of the first wire and parts of the second wire to assemble the light string, and the light string is taken out from the lamp housing carrier by the assembly machine.

In addition, the present disclosure provides an automatic assembly method for a light string by using an automatic assembly apparatus. The automatic assembly apparatus includes lamp housings, a holder and an assembly machine connected to the holder. The light string includes a first wire, a second wire, a plurality of light-emitting elements and a plurality of lamp housings. The first wire and the second wire are wound around the holder along a longitudinal direction of the holder. The light-emitting elements are attached across the first wire and the second wire. The method includes the following steps using the assembly machine to arrange the lamp housings in the lamp housings along a longitudinal direction of the lamp housing carrier; using the assembly machine to actuate the holder to move horizontally with respect to the lamp housing carrier to align the light-emitting elements with accommodating spaces of the lamp housings respectively; using the assembly machine to actuate the holder to move vertically toward the lamp housing carrier to move the light-emitting elements into the accommodating spaces respectively; using the assembly machine to remove the first wire and the second wire together with the light-emitting elements from the holder; using the assembly machine to make the first wire and the second wire through the lamp housing through holes of the lamp housings to be wound around the lamp housing carrier; using the assembly machine to place a plurality of bonding elements in the accommodating spaces of the lamp housings respectively to bond the lamp housings with the corresponding light-emitting elements, parts of the first wire and parts of the second wire to assemble the light string through the bonding elements; and using the assembly machine to take the light string out from the lamp housing carrier.

As described above, the present disclosure provides the light string and the automatic assembly apparatus and method for the light string. By using the apparatus and the method, the light-emitting elements having different lighting effects can be automatically assembled in the light string. Therefore, the present disclosure can improve production efficiency and save labor costs, such that production costs are effectively reduced, and the light string has diversified lighting effects.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
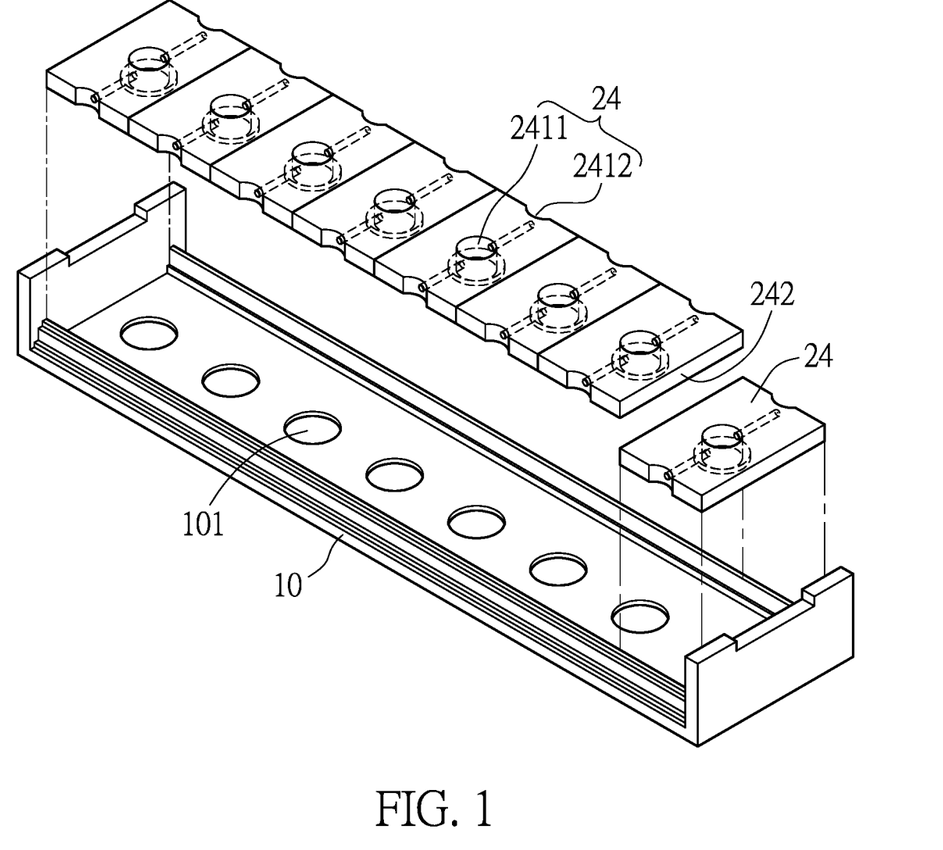
FIG. 1 is a diagram illustrating a structural configuration of a lamp housing carrier and lamp housings placed in the lamp housing carrier of an automatic assembly apparatus for a light string according to a first embodiment of the present disclosure.

Reference is made to FIG. 1, which is a configuration diagram of a lamp housing carrier and lamp housings placed in the lamp housing carrier of an automatic assembly apparatus for a light string according to a first embodiment of the present disclosure.

As shown in FIG. 1, a lamp housing carrier 10 is an elongated slot. The lamp housing carrier 10 has a plurality of carrier through holes 101 on a bottom surface thereof. The carrier through holes 101 are spaced apart from each other at a predetermined distance. A plurality of lamp housings 24 are arranged sequentially or simultaneously in the lamp housing carrier 10 along a longitudinal direction of the lamp housing carrier 10. The adjacent sides of the lamp housings 24 are in contact with each other.

The lamp housing 24 may include an accommodating portion 2411 and a decorative portion 2412. The accommodating portion 2411 and the decorative portion 2412 may be integrally formed or detachably combined. For example, the decorative portion 2412 has a rectangular parallelepiped shape, and the accommodating portion 2411 has a cylindrical shape, but the present disclosure is not limited thereto. The accommodating portion 2411 may be assembled on a side of the decorative portion 2412 or protrude from a surface of the decorative portion 2412.

The decorative portion 2412 of the lamp housing 24 may have a hollow space that extends through top and bottom surfaces of the lamp housing 24. The hollow space of the decorative portion 2412 may communicate with an accommodating space of the accommodating portion 2411. In the embodiment, the hollow space is snowflake shaped, but the present disclosure is not limited thereto. The decorative portion 2412 may have a lamp housing through hole 242, and the lamp housing through hole 242 extends through two sides of the decorative portion 2412 by connecting with the hollow space of the decorative portion 2412. Alternatively, the lamp housing through hole 242 may extend to other surfaces of the decorative portion 2412 according to particular implementations.

Figure 4:
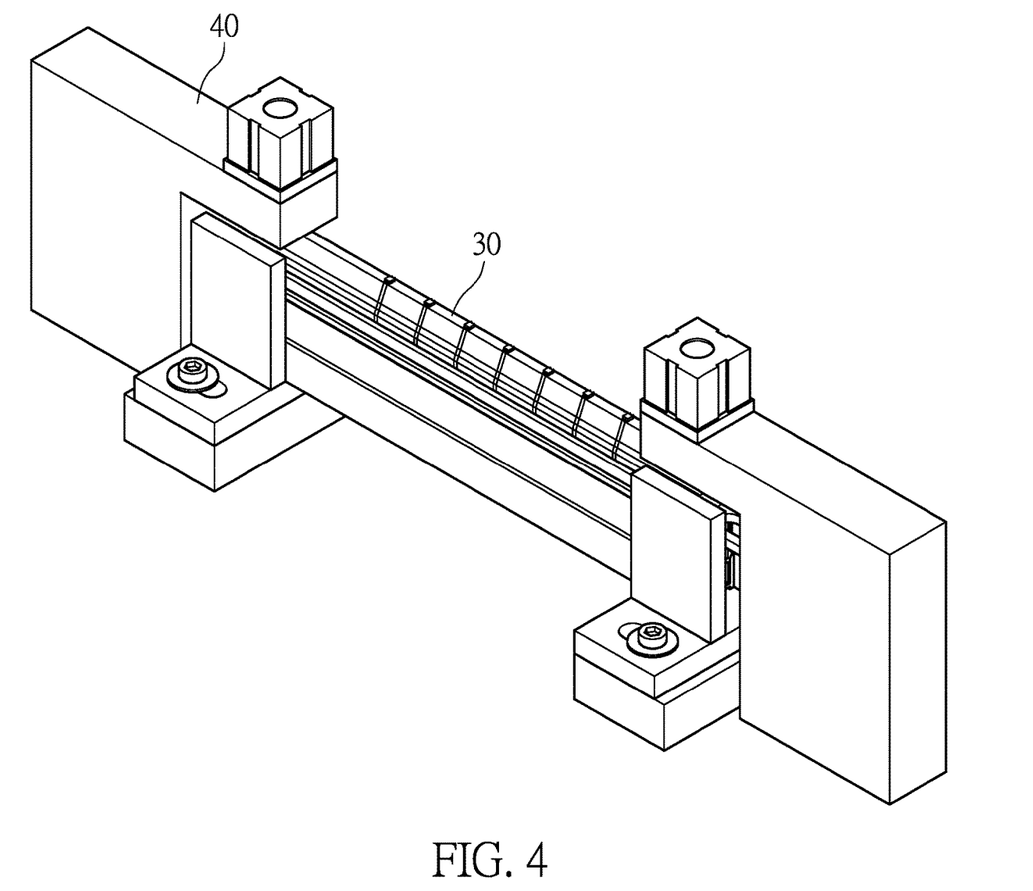
FIG. 4 is a configuration diagram of an assembly machine and the holder mounted on the assembly machine of the automatic assembly apparatus for the light string according to the first embodiment of the present disclosure.

The accommodating portion 2411 of the lamp housing 24 may have a shape corresponding to that of the carrier through hole 101 of the lamp housing carrier 10. Further, when an assembly machine 40 as shown in FIG. 4 is configured to place the lamp housings 24 in the lamp housing carrier 10, the accommodating portions 411 of the lamp housings 24 move from a surface of the lamp housing carrier 10 through the carrier through holes 101 respectively to another opposite surface of the lamp housing carrier 10. That is, the accommodating portions 2411 of the lamp housings 24 are placed under a lower surface of the lamp housing carrier 10 and the decorative portions 2412 is lain flat on the surface of the lamp housing carrier 10. Optionally, a thickness of the lamp housing 24 may be the same as a height of a groove wall of the lamp housing carrier 10. As a result, when the decorative portion 2412 is placed in the lamp housing carrier 10, an upper surface of the decorative portion 2412 of the lamp housing 24 is flush with an upper edge of the lamp housing carrier 10.

Figure 2:
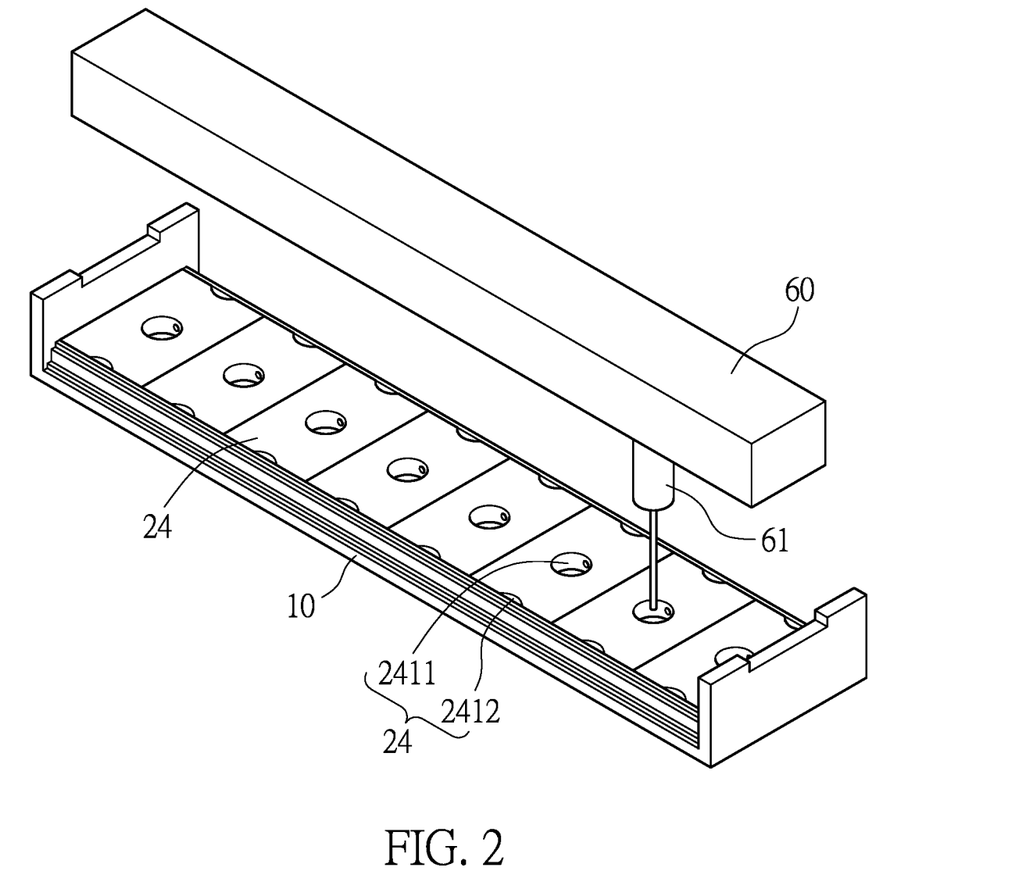
FIG. 2 is a schematic diagram of a dispensing machine of the automatic assembly apparatus for dispensing adhesives into the lamp housings according to the first embodiment of the present disclosure.

Reference is made to FIG. 2, which is a schematic diagram of a dispensing machine of the automatic assembly apparatus for dispensing adhesives into the lamp housings according to the first embodiment of the present disclosure.

As shown in FIG. 2, the assembly machine 40 may include or be additionally disposed with a dispensing machine 60. The dispensing machine 60 may have one or more dispensing nozzles 61. In the embodiment, after or before the first wire 21 and the second wire 22 pass through lamp housing through holes of the lamp housings 24 on the lamp housing carrier 10 and are wound around the lamp housing carrier 10 by the assembly machine 40, the dispensing machine 60 may actuate the dispensing nozzles 61 to move horizontally and vertically to align nozzle heads of the dispensing nozzles 61 with the accommodating spaces of the lamp housings 24, respectively. Then, a bonding substance such as an adhesive is dispensed or coated in the accommodating spaces of the lamp housings 24 either sequentially with one of the dispensing nozzles 61, or concurrently with a plurality of the dispensing nozzles 61.

Figure 3:
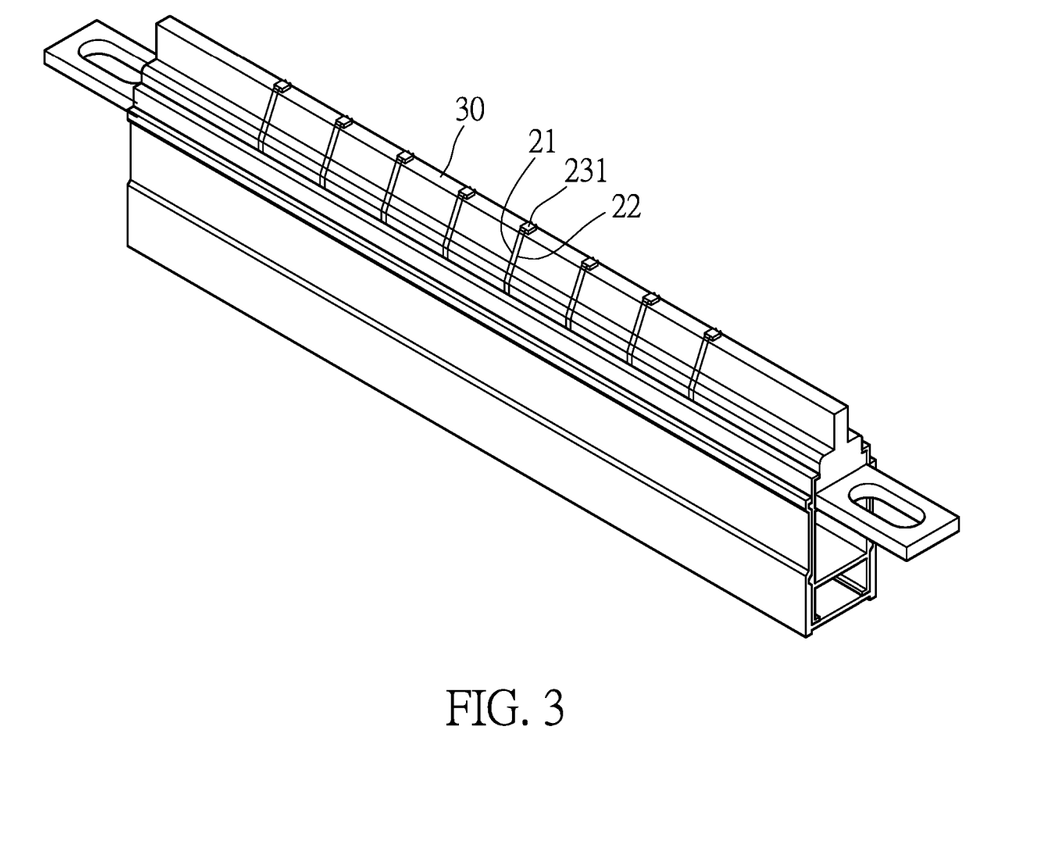
FIG. 3 is a configuration diagram of a holder, wires wound around the holder and LED chips attached on the wires of the automatic assembly apparatus for the light string according to the first embodiment of the present disclosure.

Reference is made to FIG. 3, which is a configuration diagram of a holder, wires wound around the holder and LED chips attached on the wires of the automatic assembly apparatus for the light string according to the first embodiment of the present disclosure.

As shown in FIG. 3, the assembly machine 40 may wind the first wire 21 and the second wire 22 around a holder 30 along a longitudinal direction of the holder 30. The assembly machine 40 may include or be additionally disposed with an attaching machine. The attaching machine is configured to attach a plurality of first light-emitting elements 231 such as LED chips across the first wire 21 and the adjacent second wire 22 on the holder 30.

Figure 5:
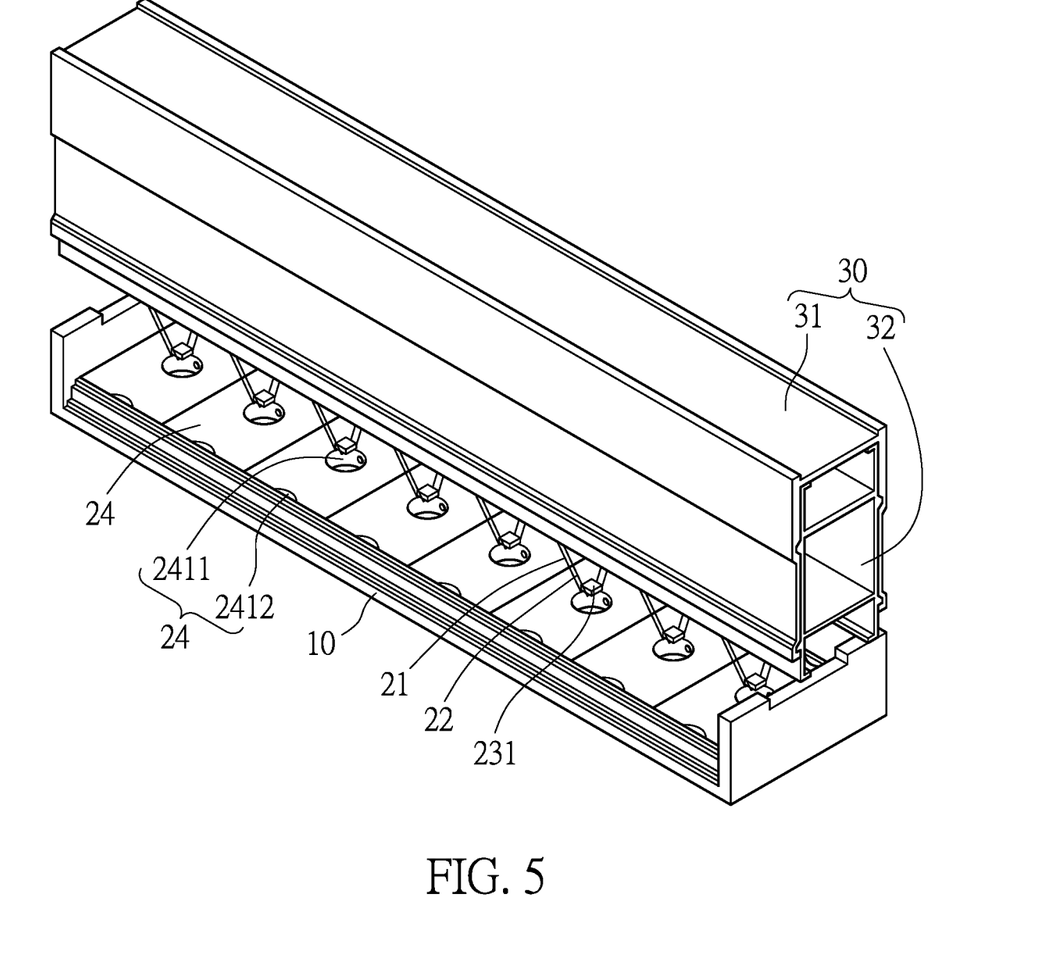
FIG. 5 is a side view of the holder and the lamp housing carrier of the automatic assembly apparatus for the light string according to the first embodiment of the present disclosure.
Figure 6:
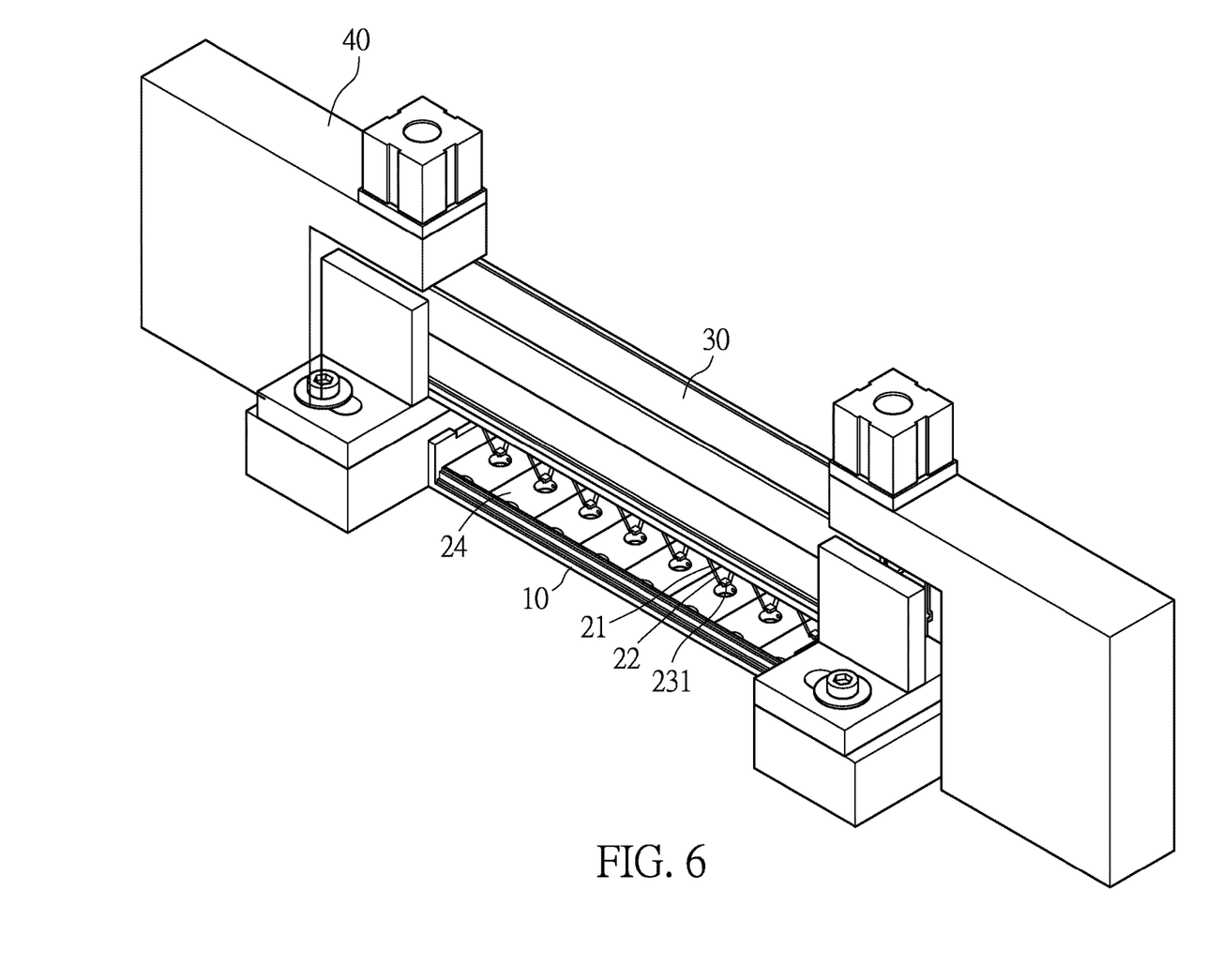
FIG. 6 is a front view of the holder and the lamp housing carrier of the automatic assembly apparatus for the light string according to the first embodiment of the present disclosure.

Reference is made to FIGS. 4 to 6. FIG. 4 is a configuration diagram of an assembly machine and the holder mounted on the assembly machine of the automatic assembly apparatus for the light string according to the first embodiment of the present disclosure; FIG. 5 is a side view of the holder and the lamp housing carrier of the automatic assembly apparatus for the light string according to the first embodiment of the present disclosure; FIG. 6 is a front view of the holder and the lamp housing carrier of the automatic assembly apparatus for the light string according to the first embodiment of the present disclosure.

As shown in FIG. 4, the holder 30 may be mounted on the assembly machine 40 and connected to an actuator of the assembly machine 40. At this time, the first light-emitting elements 231 disposed above the holder 30 face upward. When the assembly machine 40 is used to assemble the light string, the assembly machine 40 may flip the holder 30 180 degrees such that the first light-emitting elements 231 are rotated to face the lamp housing carrier 10 disposed under the holder 30 as shown in FIG. 5, and the lamp housings 24 are arranged in the lamp housing carrier 10. The different numbers and shapes of the lamp housings 24 may be selected according to particular implementations for each of the light strings, and the present disclosure is not limited thereto.

In the embodiment, the holder 30 may have a socket 31 and a projection 32. The projection 32 may have an H-shaped cross section. The projection 32 is detachably disposed in the socket 31. At this time, a protruding portion in the middle of the projection 32 may protrude beyond a surface of the housing 31 that faces the lamp housing carrier 10. As shown in FIGS. 3 and 4, the first wire 21 and the second wire 22 are wound around the socket 31 and the projection 32 of the holder 30. The first light-emitting elements 231 are spaced apart from each other and placed on the projection 32 of the holder 30.

Further, as shown in FIG. 5, the assembly machine 40 may adjust a winding state of he first wire 21 and the second wire 22 around the holding member 30. For example, first wire segments of the first wire 21 and second wire segments of the second wire 22 are moved down to a position at which those wire segments do not contact with the holder 30 and the assembly machine 40 from a position at which those wire segments are in contact with the holder 30. The first light-emitting elements 231 attached across the first wire segments and the second wire segments are no longer lain flat on the projection 32 of the holder 30.

The assembly machine 40 may move the holder 30 with respect to the lamp housing carrier 10 such that the first light-emitting elements 231 are aligned with the accommodating spaces of the lamp housings 24 respectively. The assembly machine 40 may then move the holder 30 toward the lamp housing carrier 10 to move the first light-emitting elements 231 into the accommodating spaces of the lamp housings 24 respectively.

For example, the light string 20 may further include a plurality of second light-emitting elements in addition to the first light-emitting elements 231. The second light-emitting elements and the first light-emitting elements 231 may be attached back-to-back respectively. After the assembly machine 40 actuates the holder 30 to move, the second light-emitting elements may be placed into the accommodating spaces of the lamp housings 24 together with the first light-emitting elements 231.

The first light-emitting elements 231 and the second light-emitting elements may be bonded to the corresponding lamp housings 24 through the bonding elements accommodated in the accommodating spaces of the lamp housings 24, respectively. In addition, the first wire 21 and the second wire 22 in the lamp housings 24 may also be bonded with the lamp housings 24 through the bonding elements, respectively. As a result, the lamp housing 24 can be fixed at a position of the first wire 21 and a position of the second wire 22 and would not be moved or dropped off.

If the bonding elements are adhesives, after the adhesives cure, the assembly machine 40 fixes the lamp housings 24 on the first wire 21 and the second wire 22, and then remove the first light-emitting elements 231 and the second light-emitting elements together with the first wire 21 and the second wire 22 from the holder 30. At this time, the first light-emitting elements 231 and the second light-emitting elements are maintained in the accommodation spaces of the corresponding lamp housings 24.

The assembly machine 40 then passes the first wire 21 and the second wire 22 through the lamp housing through holes 242 of the lamp housings 24. In this manner, the first wire 21, the second wire 22, the first light-emitting elements 231, and the lamp housings 24 can be assembled into the light string. Finally, the assembly machine 40 takes the light string out from the lamp housing carrier 10.

Figure 7:
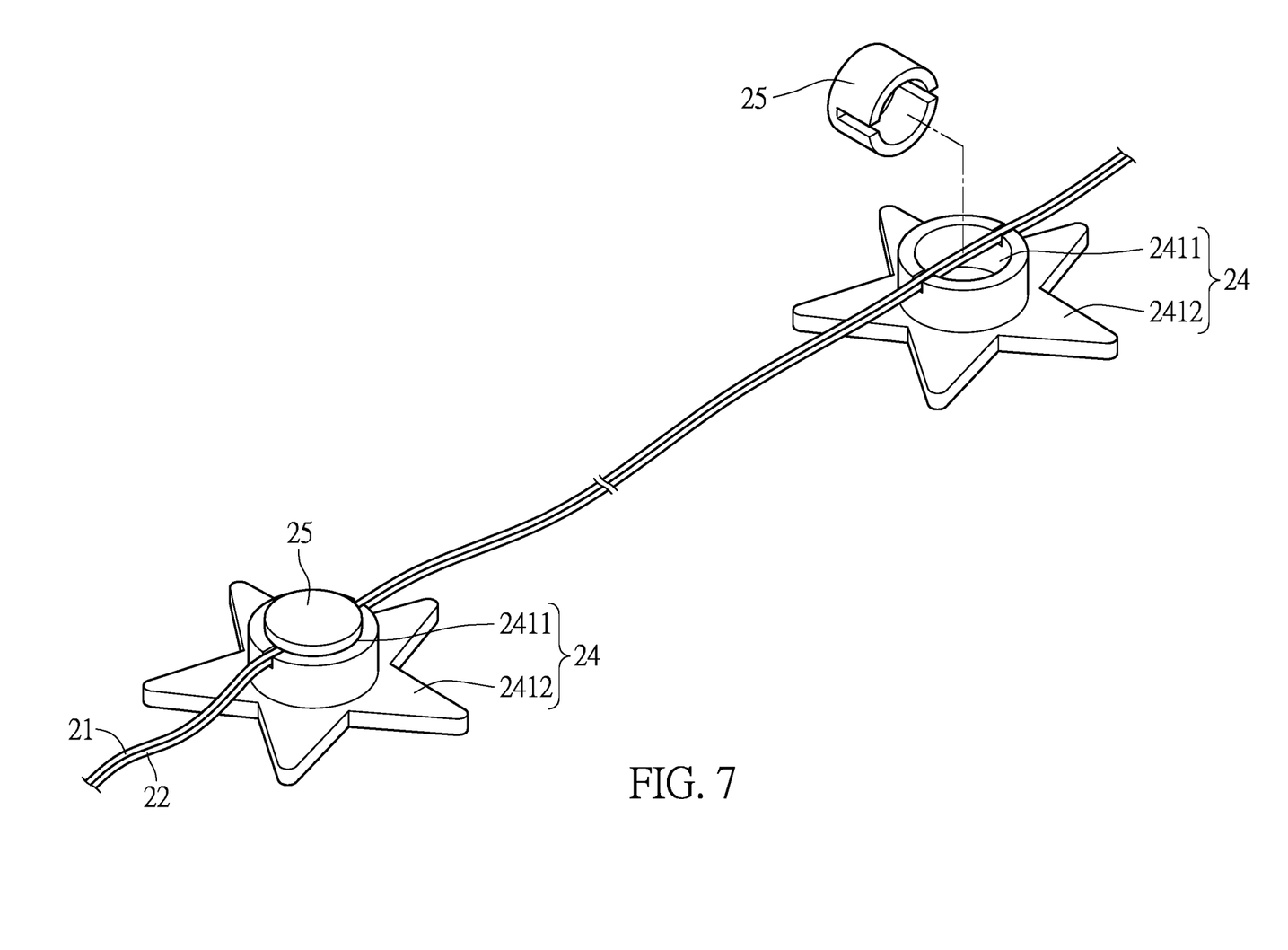
FIG. 7 is a schematic diagram of a light string according to a second embodiment of the present disclosure.

Reference is made to FIG. 7, which is a schematic diagram of a light string according to a second embodiment of the present disclosure. The light string includes a first wire 21, a second wire 22, a plurality of light emitting elements, and a plurality of lamp housings 24.

The accommodating portion 2411 of the lamp housing 24 is located on a surface of the decorative portion 2412 of the lamp housing 24. The decorative portion 2412 may have a solid star-shaped body, but the present disclosure is not limited thereto. The decorative portion 2412 and the accommodating portion 2411 of the lamp housing 24 may be disconnected from each other. The accommodating portion 2411 has a through hole.

Further, the first wire 21 and the second wire 22 pass through the through hole. The light-emitting elements are attached across the first wire segments of the first wire 21 and the adjacent second wire segments of the second wire 22 in the lamp housings 24.

The accommodating portion 2411 of the lamp housing 24 has an opening facing away from the decorative portion 2412. Therefore, the plugs 25 may then be obtained and then inserted into the accommodating spaces of the lamp housings 24, for example, by using the assembly machine, to hold the first light-emitting elements 231 in the accommodating spaces by the plugs 25 respectively.

Figure 8:
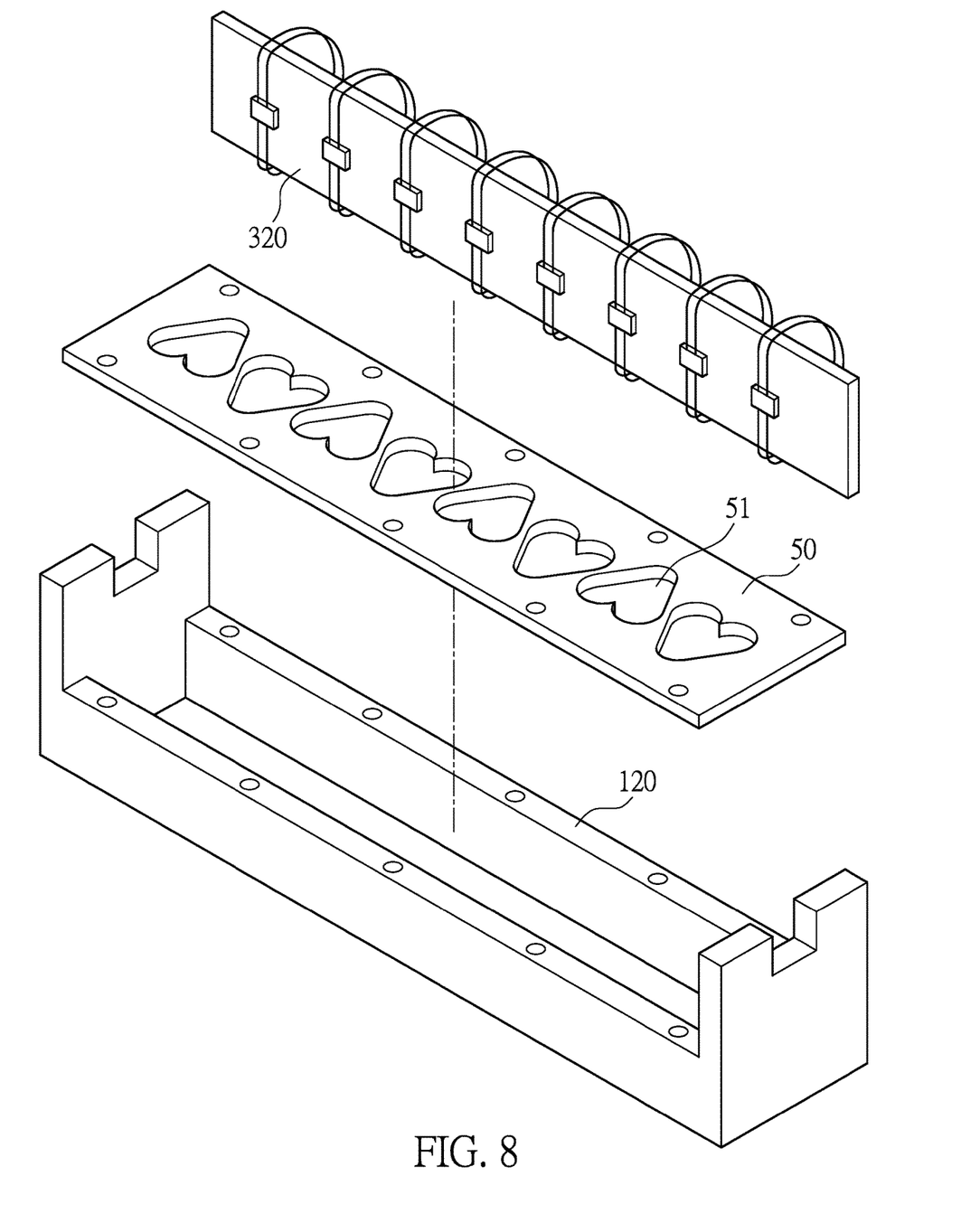
FIG. 8 is a diagram illustrating a structural configuration of a lamp housing carrier, a mold and a holder of an automatic assembly apparatus for a light string according to a third embodiment of the present disclosure.
Figure 9:
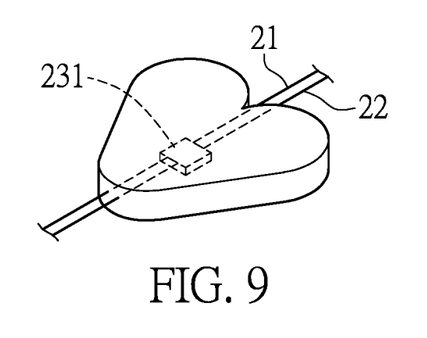
FIG. 9 is a schematic diagram of the light string according to the third embodiment of the present disclosure.

Reference is made to FIGS. 8 and 9. FIG. 8 is a configuration diagram of a lamp housing carrier, a mold and a holder of an automatic assembly apparatus for a light string according to a third embodiment of the present disclosure; FIG. 9 is a schematic diagram of the light string according to the third embodiment of the present disclosure.

As shown in FIG. 8, the lamp housing carrier 120 has a hollow elongated shape. The mold 50 has a plurality of grooves 51 having shapes corresponding to that of the lamp housings 24 respectively. The grooves 51 may have the same or different shapes. In the embodiment, the grooves 51 are heart shape bodies, but the present disclosure is not limited thereto.

Further, the assembly machine may obtain the mold 50 and mount the mold 50 on a lamp housing carrier 120, and then place the lamp housings 24 into the grooves 51 of the mold 50 respectively. The assembly machine removes the first wire 21 and the second wire 22 together with the first light-emitting elements 231 attached across the first wire 21 and the second wire 22 as shown in FIG. 9 from a holder 320.

The assembly machine may move the first light-emitting elements 231 into the accommodating spaces of the lamp housings 24 respectively. The first light-emitting elements 231 are bonded to the lamp housings 24 through the bonding elements in the lamp housing 24 respectively. The first wire 21 and the second wire 22 pass through the lamp housing through holes of the lamp housings 24 and are wound around the lamp housing carrier 120. The bonding elements such as adhesives are then accommodated in the accommodating spaces of the lamp housings 24 respectively. The bonding elements are used to bond the lamp housings 24 with the first light-emitting elements 231 respectively, parts of the first wire 21 and parts of the second wire 22 to assemble the light string. For example, as shown in FIG. 9, one of the first light-emitting elements 231 of the light string has a heart-shaped body.

Figure 10:
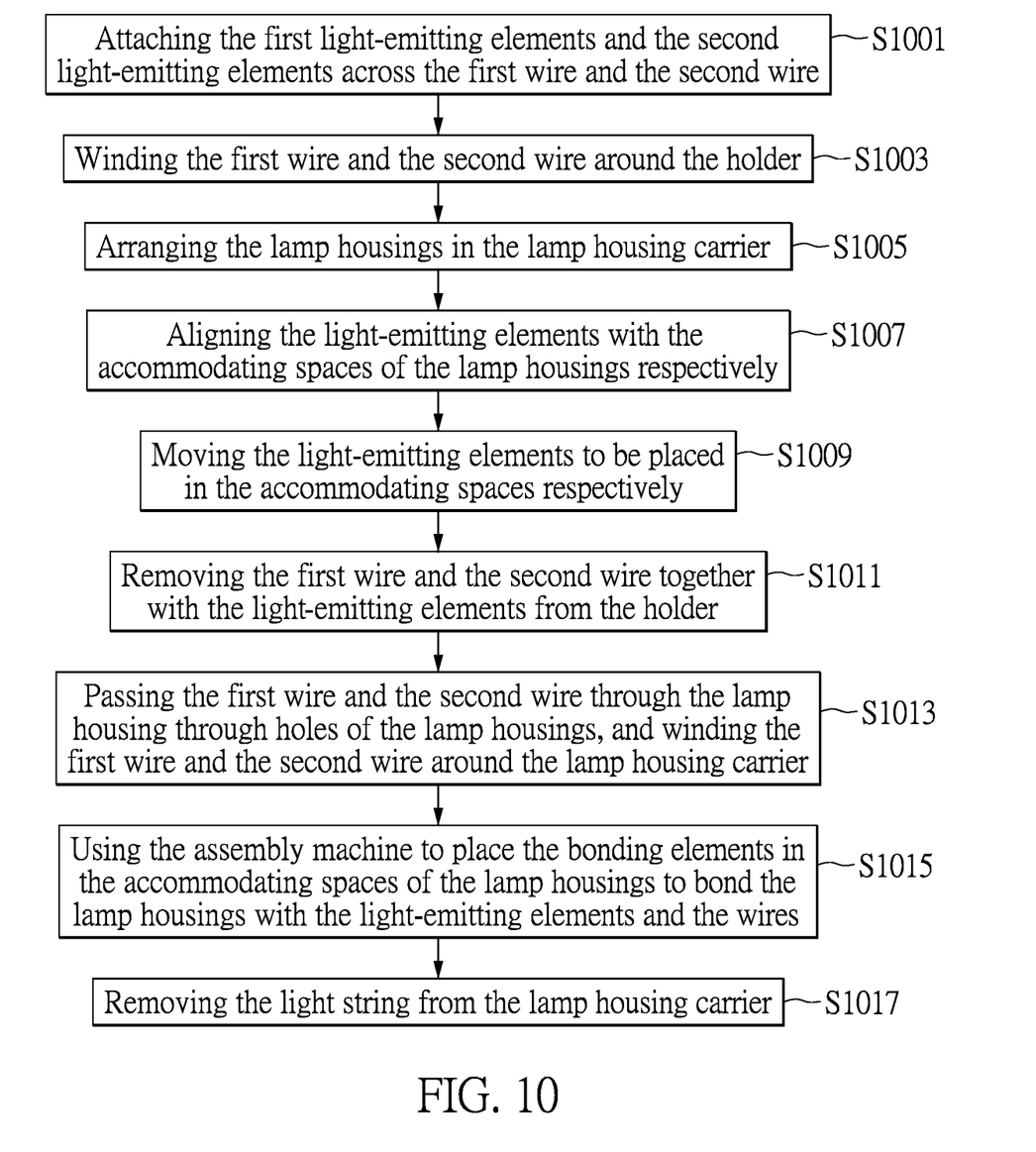
FIG. 10 is flowchart of an automatic assembly method for a light string according to a fourth embodiment of the present disclosure.

Reference is made to FIG. 10, which is flowchart of an automatic assembly method for a light string according to a fourth embodiment of the present disclosure. As shown in FIG. 10, in the embodiment, the method includes the following steps S1001 to S1017 for the automatic assembly apparatus and the above light string.

In step S1001, the light-emitting elements are attached across the first wire and the second wire by the assembly machine.

In step S1003, the first wire and the second wire are wound around the holder along the longitudinal direction of the holder by the assembly machine, wherein the first wire and the second wire are spaced from each other at the predetermined distance.

In step S1005, the lamp housings are arranged in the lamp housing carrier along the longitudinal direction of the lamp housing carrier by the assembly machine.

In step S1007, the holder is actuated to move horizontally by the assembly machine with respect to the lamp housing carrier to align the light-emitting elements with accommodating spaces of the lamp housings, respectively.

In step S1009, the holder is actuated to move vertically toward the lamp housing carrier by the assembly machine to move the light-emitting elements into the accommodating spaces, respectively.

In step S1011, the first wire and the second wire are removed together with the light-emitting elements from the holder by the assembly machine.

In step S1013, the first wire and the second wire pass through the lamp housing through holes of the lamp housings and are around the lamp housing carrier by the assembly machine.

In step S1015, the bonding elements are accommodated in the accommodating spaces of the lamp housings respectively to bond the lamp housings with the corresponding light-emitting elements, parts of the first wire and parts of the second wire through the bonding elements to assemble the light string by the assembly machine.

In step S1017, the assembly machine takes the light string out from the lamp housing carrier.

The above step S1015 may include: using the assembly machine to dispense the adhesives into the accommodating spaces of the lamp housings respectively; and drying the adhesives inside the accommodating spaces of the lamp housings by an oven.

For step S1015, the method may further include the following steps: using the assembly machine to place the lamp housings in the lamp housing carrier, wherein the adjacent sides of the lamp housings are in contact with each other; using the assembly machine to pass the accommodating portions of the lamp housings pass from a surface of the lamp housing carrier through the carrier through holes respectively to another opposite surface of the lamp housing carrier; and using the assembly machine to lie flat the decorative portion on the surface of the lamp housing carrier, wherein the upper surface of each of the lamp housings is flush with the upper edge of the lamp housing carrier.

Alternatively, regarding step S1015, the method may include the following steps for replacing the above step S1015: using the assembly machine to obtain the mold and mount the mold on the lamp housing carrier; and using the assembly machine to obtain the lamp housings and place the lamp housings into the grooves of the mold respectively.

In addition, the method may further include the following steps after step S1015: using the assembly machine to obtain the plugs and then insert the plugs into the accommodating spaces of the lamp housings respectively to hold the light-emitting elements in the accommodating spaces respectively.

In summary, the present disclosure provides the light string and the automatic assembly apparatus and the automatic assembly method for the light string, wherein the apparatus and the method are capable of automatically assembling the light string with the light-emitting elements having different lighting effects. Therefore, the present disclosure can improve production efficiency and save labor, thereby effectively reducing production costs are effectively reduced, and allowing the light string to have diversified lighting effects.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An automatic assembly apparatus of a light string, the light string including a first wire, a second wire, a plurality of light-emitting elements and a plurality of lamp housings, the automatic assembly apparatus comprising:
   a lamp housing carrier, wherein the lamp housings are arranged in the lamp housing carrier along a longitudinal direction of the lamp housing carrier, and each of the lamp housings has an accommodating space and a lamp housing through hole penetrating through the lamp housing body;
   a holder around which the first wire and the second wire are wound around the holder along a longitudinal direction of the holder, and the light-emitting elements are attached across the first wire and the second wire that are adjacent to each other; and
   an assembly machine connected to the holder, wherein the assembly machine is configured to actuate the holder to move the light-emitting elements into the accommodating spaces of the lamp housings respectively, remove the light-emitting elements together with the first wire and the second wire from the holder, pass the first wire and the second wire through the lamp housing through holes of the lamp housings to be wound around the lamp housing carrier, place a plurality of bonding elements in the accommodating spaces of the lamp housings respectively to bond the lamp housings with the corresponding light-emitting elements, parts of the first wire and parts of the second wire through the bonding elements to assemble the light string and the light string is taken out from the lamp housing carrier.

2. The apparatus of claim 1, wherein the holder includes a socket and a projection mounted in the socket, a portion of the projection protrudes beyond a surface of the socket that faces the lamp housing carrier, the first wire and the second wire are wound around the socket and the projection, and the light-emitting elements are placed on the projection.

3. The apparatus of claim 1, wherein the lamp housing carrier has a plurality of carrier through holes, each of the lamp housings includes an accommodating portion and a decorative portion that are communicated with each other, the accommodating portion protrudes from a surface of the decorative portion, when the assembly machine places the lamp housings in the lamp housing carrier, the accommodating portions moves to a surface of the lamp housing carrier from another opposite surface of the lamp housing carrier through the carrier through holes respectively, and the decorative portion lies flat on the surface of the lamp housing carrier.

4. The apparatus of claim 1, wherein the assembly machine obtains a plurality of plugs and then inserts the plugs into the accommodating spaces of the lamp housings respectively such that the light-emitting elements are held in the accommodating spaces by the plugs respectively.

5. The apparatus of claim 1, further comprising a mold having a plurality of grooves, wherein shapes of the grooves correspond to shapes of the lamp housings respectively, and the assembly machine obtains the mold and mounts the mold on the lamp housing carrier, and then obtains the lamp housings into the grooves of the mold respectively.

6. A light string assembled by using an automatic assembly apparatus, the automatic assembly apparatus including a lamp housing carrier, a holder and an assembly machine connected to the holder, the light string comprising:
   a plurality of lamp housings arranged in the lamp housing carrier along a longitudinal direction of the lamp housing carrier, wherein each of the lamp housings has an accommodating space and a lamp housing through hole extending through the lamp housing body;
   a first wire and a second wire wound around the holder along a longitudinal direction of the holder at a predetermined distance; and
   a plurality of first light-emitting elements attached across the first wire and the second wire;
   wherein the first light-emitting elements are placed into the accommodating spaces of the lamp housings respectively, the first wire and the second wire pass through the lamp housing through holes of the lamp housings and are wound around the lamp housing carrier, a plurality of bonding elements are accommodated in the accommodating spaces of the lamp housings respectively, and bond the lamp housings are bonded with the first light-emitting elements via the bonding elements respectively.

7. The light string of claim 6, further comprising a plurality of second light-emitting elements that are attached back-to-back with the plurality of first light-emitting elements respectively, wherein the second light-emitting elements are placed into the accommodating spaces of the lamp housings to be bonded with the lamp housings through the bonding elements respectively.

8. The light string of claim 6, wherein each of the lamp housings includes a decorative portion and an accommodating portion that are communicated with each other, the accommodating portion protrudes from a surface of the decorative portion, the decorative portion has a hollow space communicated with the accommodating space of the accommodating portion, the lamp housing through hole extends through the decorative portion to the hollow portion, and the first wire and the second wire pass through the lamp housing through hole through the hollow space.

9. The light string of claim 6, further comprising a plurality of plugs, inserted into the accommodating spaces of the lamp housings respectively such that the first light-emitting elements are held in the accommodating spaces by the plugs, respectively.

10. An automatic assembly method for a light string by using an automatic assembly apparatus, the automatic assembly apparatus including a lamp housing, a holder and an assembly machine connected to the holder, the light string including a first wire, a second wire, a plurality of light-emitting elements and a plurality of lamp housings, the first wire and the second wire wound around the holder along a longitudinal direction of the holder, the light-emitting elements attached across the first wire and the second wire, the method comprising the following steps:
   using the assembly machine to arrange the lamp housings in the lamp housing carrier along a longitudinal direction of the lamp housing carrier;
   using the assembly machine to actuate the holder to move horizontally with respect to the lamp housing carrier to align the light-emitting elements with accommodating spaces of the lamp housings respectively;
   using the assembly machine to actuate the holder to move vertically toward the lamp housing carrier to move the light-emitting elements into the accommodating spaces respectively;
   using the assembly machine to remove the first wire and the second wire together with the light-emitting elements from the holder;
   using the assembly machine to pass the first wire and the second wire through the lamp housing through holes of the lamp housings to be wound around the lamp housing carrier;
   using the assembly machine to place a plurality of bonding elements in the accommodating spaces of the lamp housings, respectively, to bond the lamp housings with the corresponding light-emitting elements, parts of the first wire and parts of the second wire to assemble the light string through the bonding elements; and
   using the assembly machine to take the light string out from the lamp housing carrier.

11. The method of claim 10, further comprising steps of:
   using the assembly machine to place the lamp housings in the lamp housing carrier, wherein adjacent sides of the lamp housings are in contact with each other;
   using the assembly machine to pass accommodating portions of the lamp housings through carrier through holes of the lamp housing carrier to a surface of the lamp housing carrier from another opposite surface of the lamp housing carrier; and
   using the assembly machine to lie flat the decorative portion on the surface of the lamp housing carrier such that an upper surface of each of the lamp housings is flush with an upper edge of the lamp housing carrier.

12. The method of claim 10, further comprising a step of:
   using the assembly machine to obtain a plurality of plugs and then insert the plugs into the accommodating spaces of the lamp housings respectively such that the light-emitting elements are respectively held in the accommodating spaces by the plugs.

13. The method of claim 10, further comprising steps of:
   using the assembly machine to obtain the mold and mount the mold on the lamp housing carrier; and
   using the assembly machine to obtain the lamp housings and place the lamp housings into the grooves of the mold respectively.

14. The method of claim 10, wherein the step of using the assembly machine to accommodate the plurality of bonding elements in the accommodating spaces of the lamp housings respectively to bond the lamp housings with the light-emitting elements through the bonding elements respectively, parts of the first wire and parts of the second wire to assemble the light string includes:
   using the assembly machine to dispense adhesives into the accommodating spaces of the lamp housings respectively; and
   drying the adhesives in the accommodating spaces by an oven.

* * * * *